US011105865B2

(12) United States Patent
Kim et al.

(10) Patent No.: US 11,105,865 B2
(45) Date of Patent: Aug. 31, 2021

(54) HIGH-SENSITIVITY MULTI-CHANNEL ATOMIC MAGNETOMETER

(71) Applicant: Triad National Security, LLC, Los Alamos, NM (US)

(72) Inventors: Young Jin Kim, Los Alamos, NM (US); Igor Mykhaylovych Savukov, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 0 days.

(21) Appl. No.: 16/578,816

(22) Filed: Sep. 23, 2019

(65) Prior Publication Data

US 2020/0103475 A1 Apr. 2, 2020

Related U.S. Application Data

(60) Provisional application No. 62/738,073, filed on Sep. 28, 2018.

(51) Int. Cl.
*G01R 33/032* (2006.01)
(52) U.S. Cl.
CPC .................. *G01R 33/0322* (2013.01)
(58) Field of Classification Search
CPC ............... G01R 33/0322; G01R 33/26
USPC ....................................... 324/244.1
See application file for complete search history.

(56) References Cited

U.S. PATENT DOCUMENTS

| 8,212,556 B1 * | 7/2012 | Schwindt ............... G01R 33/26 324/304 |
| 9,995,800 B1 | 6/2018 | Schwindt et al. |
| 2014/0159718 A1 * | 6/2014 | Larsen .................. G01R 33/60 324/301 |

(Continued)

OTHER PUBLICATIONS

Bison, et al. "A room temperature 19-channel magnetic field mapping device for cardiac signals" 2009; Applied Physics Letters; vol. 95; 3 pages.

(Continued)

*Primary Examiner* — Christopher P McAndrew

(57) ABSTRACT

High-sensitivity multi-channel atomic magnetometers are described. Methods for operating multi-channel atomic magnetometers are also described. Moreover, devices incorporating a plurality of multi-channel atomic magnetometers are described. A multi-channel atomic magnetometer may use the spin-exchange relaxation-free (SERF) technique. A multi-channel atomic magnetometer may achieve multi-channel operation in a single module, reducing the cost of sensors. A multi-channel atomic magnetometer may be a 16-channel atomic magnetometer. A multi-channel atomic magnetometer may include a single large vapor cell including alkali-metal atoms and at least one buffer gas that restricts motion of atomic spins of the alkali-metal atoms, thereby making relatively small internal cell volumes act as a multiple independent local sensing channels. A multi-channel atomic magnetometer may include a broad pump beam that simultaneously polarizes all (or substantially all) of the alkali-metal atoms in each internal sensing volume of the vapor cell, and a broad probe beam that simultaneously measures magnetic fields at multiple sensing volumes with a photodiode array.

20 Claims, 11 Drawing Sheets

(56) References Cited

U.S. PATENT DOCUMENTS

| | | | | |
|---|---|---|---|---|
| 2014/0247045 A1* | 9/2014 | Kornack | ............... | G01R 33/26 324/304 |
| 2016/0291099 A1* | 10/2016 | Ueno | ..................... | A61B 5/055 |
| 2016/0313418 A1* | 10/2016 | Fujii | ..................... | G01R 33/26 |
| 2017/0023653 A1* | 1/2017 | Kobayashi | ............. | G01R 33/26 |

OTHER PUBLICATIONS

Kim, et al. "Multi-channel atomic magnetometer for magnetoencephalography: A configuration study" 2014; NeuroImage; vol. 89; pp. 143-151.

Storm, et al. "A modular, extendible and field-tolerant multichannel vector magnetometer based on current sensor SQUIDs" 2016; Superconductor Science and Technology; vol. 29; 9 pages.

Allred, et al. "High-Sensitivity Atomic Magnetometer Unaffected by Spin-Exchange Relaxation" 2002; Physical Review Letters; vol. 89; No. 13; 4 pages.

Kominis, et al. "A subfemtotesla multichannel atomic magnetometer" 2003; Nature; vol. 422; pp. 596-599.

Elekta, "Elekta Neuromag TRIUX: State-of-the-art Magnetoencephalography," www.elekta.com, 7 pages.

Johnson, et al. "Magnetoencephalography with a two-color pump-probe, fiber-coupled atomic magnetometer" 2010; Applied Physics Letters vol. 97; 3 pages.

Karaulanov, et al. "Spin-exchange relaxation-free magnetometer with nearly parallel pump and probe beams" 2016; Measurement Science and Technology; vol. 27; 8 pages.

Baule, et al. "Detection of the magnetic field of the heart" 1963; Department of Electrical Engineering; Syracuse University; 2 pages.

Hart "Biomagnetometry: imaging the heart's magnetic field" 1991; British Heart Journal; vol. 65; pp. 61-62.

Smith, et al. "Comparison of magnelocardiography and electrocardiography: a study of automatic measurement of dispersion of ventricular repolarization" 2006; European Society of Cardiology; vol. 8; pp. 887-893.

Lee, et al. "Multichannel MCG Systems with Optimum Combinations of Pickup Coils and Shielded Rooms" 2007; Proceedings of NFSI and ICFBI, Hangzhou, China; pp. 297-300.

Nomura, et al. "Noninvasive Localization of Accessory Pathways by Magnetocardiographic Imaging" 1994; Clinical Investigations; vol. 17; pp. 239-244.

Cohen, et al. "Magnetocardiograms taken inside a shielded room with a superconducting point-contact magnetometer" 1970; Applied Physics Letters; vol. 16; pp. 278-280.

Kamada, et al. "Human MCG measurements with a high-sensitivity potassium atomic magnetometer" 2012; Physiological Measurement; vol. 33; pp. 1063-1071.

Morales, et al. "Magnetocardiography measurements with 4He vector optically pumped magnetometers at room temperature" 2017; Physics in Medicine & Biology; vol. 62; pp. 7267-7279.

Budker, et al. "Optical magnetometry" 2007; Nature Physics; vol. 3; pp. 227-234.

Seltzer, et al. "Unshielded three-axis vector operation of a spin-exchange-relaxation-free atomic magnetometer" 2004; Applied Physics Letters; vol. 85; No. 20; pp. 4804-4806.

Bison, et al. "A laser-pumped magnetometer for the mapping of human cardiomagnetic fields" 2003; Applied Physics B, Lasers and Optics; vol. 76; pp. 325-328.

* cited by examiner

HIGH-SENSITIVITY MULTI-CHANNEL ATOMIC MAGNETOMETER

FEDERALLY SPONSORED RESEARCH OR DEVELOPMENT

The United States government has rights in this invention pursuant to Contract No. 89233218CNA000001 between the United States Department of Energy (DOE), the National Nuclear Security Administration (NNSA), and Triad National Security, LLC for the operation of Los Alamos National Laboratory.

BACKGROUND

Multi-channel parallel magnetic measurements are used for a variety of applications in various fields including, for example, neuroscience and high-precision fundamental physics in order to accelerate magnetic measurements. Current commercial high-sensitivity multi-channel magnetic sensors are based on arrays of low-temperature superconducting quantum interference device (SQUID) magnetometers. An example is a 306 SQUID-based sensor for a full-head magnetoencephalography (MEG) system. Such sensors have several challenges, such as cryogenic operation, high cost, and limited resolution.

To address the aforementioned problems, some efforts have been directed toward developing a non-cryogenic multi-channel magnetic sensor based on a spin-exchange relaxation-free (SERF) atomic magnetometer reaching femtotesla sensitivity at low frequency. For example, the Romalis's group at Princeton University demonstrated a MEG application with a SERF-based large-cell multi-channel atomic magnetometer. However, this sensor system has several limitations, including an inflexible sensor position and a significantly inefficient hot-air oven heating.

SUMMARY

The present disclosure provides high-sensitivity multi-channel atomic magnetometers. The present disclosure also provides methods for operating multi-channel atomic magnetometers in a single module. The present disclosure also provides an application of multi-channel atomic magnetometers. Moreover, the present disclosure provides devices incorporating a plurality of multi-channel atomic magnetometers.

A multi-channel atomic magnetometer of the present disclosure may include a single large alkali-metal vapor cell filled with at least one buffer gas, which restricts motion of alkali-metal atomic spins in the vapor cell, making relatively small internal cell volumes act as multiple independent local sensing channels. In at least some examples, a single-cell multi-channel atomic magnetometer of the present disclosure may provide 16 independent local sensing channels.

A multi-channel atomic magnetometer of the present disclosure may include two broad laser beams overlapping in a vapor cell. A circularly polarized broad pump beam may simultaneously polarize all (or substantially all) atomic spins of alkali-metal atoms in each sensing volume in the vapor cell, and a linearly polarized broad probe beam may simultaneously measure magnetic fields in multiple sensing volumes with, for example, a two-dimensional multi-channel photodiode array. In at least some examples, the magnetic measurement is done via the Faraday effect, a magneto-optical phenomenon referring to the polarization plane rotation of a linearly polarized laser beam in a medium in a magnetic field. The foregoing approach, based on a single large vapor cell and two broad laser beams, can realize multi-channel magnetic sensing in a single module. The single-module multi-channel atomic magnetometer of the present disclosure reduces the cost of multi-channel atomic magnetometers by an order of magnitude and minimizes the fabrication efforts compared to multi-channel atomic magnetometers composed of multiple separate individual sensing channels (i.e., multiple vapor cells, multiple pump beams, and multiple probe beams).

A multi-channel atomic magnetometer of the present disclosure may include an innovative nearly parallel configuration of laser beams and optical fibers to facilitate multi-channel design and sensor positioning, respectively. A multi-channel atomic magnetometer may, in at least some examples, include an oven design based on transparent electrical heaters that achieve uniform temperature across a vapor cell.

A multi-channel atomic magnetometer of the present disclosure may demonstrate magnetic-field sensitivity in each sensing channel of the atomic magnetometer of a few tens femtotesla at low frequency. Because of potential advantages of this approach over known technologies of highly sensitive parallel magnetic detection, it is envisioned that a multi-channel atomic magnetometer of the present disclosure can be used in various applications, such as magnetoencephalography (MEG), magnetocardiography (MCG), magnetic micro-particle imaging, as well as other research, diagnostic, and measurement applications. In MEG, the sensitivity and resolution may be improved and, due to the flexibility in magnetometer positioning, a first size-adjustable pediatric system can be introduced.

A multi-channel atomic magnetometer of the present disclosure uses the spin-exchange relaxation-free (SERF) technique, in which the effects of spin-exchange collisions on spin relaxation are tuned off, thereby dramatically improving sensitivity. Some innovative features of a single-module high-sensitivity multi-channel atomic magnetometer of the present disclosure include, but are not limited to: (1) a large array of sensing channels in a single large alkali-metal vapor cell, which reduces cost by about 10 times; (2) a fiber optic design allowing sensor position to be easily adjustable, which has advantages over the rigid Princeton sensor design referred to above; (3) a parallel beam configuration, which facilitates multi-channel design; (4) a reduced stand-off distance to target magnetic sources with mirror reflection, thereby improving source localization; and (5) a room temperature operation and simple magnetic shield implementation that further reduces cost.

An aspect of the present disclosure relates to a single-module multi-channel atomic magnetometer that operates at room temperature. The single-module multi-channel atomic magnetometer comprises: a single vapor cell comprising alkali-metal atoms and at least one buffer gas, the at least one buffer gas restricting motion of atomic spins of the alkali-metal atoms to produce a plurality of localized sensing volumes within the single vapor cell; a broad pump beam configured to orient electron spins of the alkali-metal atoms in a direction of the broad pump beam; a broad probe beam configured to measure tilts of electron spins with respect to an initial orientation caused by the broad pump beam, the tilts being produced by interactions between external magnetic fields and the oriented electron spins; and a photodiode array configured to output a plurality of signals, each of the plurality of signals representing tilts of electron spins corresponding to a different sensing volume within the single vapor cell. In at least some examples, the alkali-metal atoms comprise at least one of rubidium, potassium, or cesium. In at least some examples, the at least one buffer gas comprises at least one of helium or xenon. In at least some examples, the broad pump beam is circularly polarized. In at least some examples, the broad probe beam is linearly polarized. In at least some examples, the broad pump beam and the broad probe beam are simultaneously applied to the single vapor cell in a substantially parallel configuration. In at least some examples, the single-module multi-channel atomic magnetometer further comprises a distributed feedback (DFB) laser and an optical fiber. The DFB laser is configured to provide one of the broad pump beam or the broad probe beam to the optical fiber, and the broad pump beam or the broad probe beam contacts the single vapor cell after the broad pump beam or the broad probe beam is emitted from the optical fiber. In at least some examples, the single-module multi-channel atomic magnetometer further comprises a beam splitter configured to receive the broad probe beam after the broad probe beam is emitted from the single vapor cell, the beam splitter further configured to split the broad probe beam into a first beam and a second beam, the beam splitter configured to direct the first beam to the photodiode array, the beam splitter configured to direct the second beam to a second photodiode array configured for normalization operations.

Another aspect of the present disclosure relates to a method for operating a multi-channel atomic magnetometer in a single module. The method comprises receiving a single vapor cell comprising alkali-metal atoms and at least one buffer gas, the at least one buffer gas restricting motion of atomic spins of the alkali-metal atoms to produce a plurality of localized sensing volumes within the single vapor cell; orienting, using a broad pump beam, electron spins of the alkali-metal atoms in a direction of the broad pump beam; after the orienting, measuring, using a broad probe beam, a tilts of electron spins with respect to an initial orientation caused by the broad pump beam, the tilts being produced by interactions between external magnetic fields and the oriented electron spins; and outputting, using a photodiode array, a plurality of signals, each of the plurality of signals representing tilts of electron spins corresponding to a different sensing volume within the single vapor cell. In at least some examples, the alkali-metal atoms comprise at least one of rubidium, potassium, or cesium. In at least some examples, the at least one buffer gas comprises at least one of helium or xenon. In at least some examples, the broad pump beam is circularly polarized, the broad probe beam is linearly polarized, and the broad pump beam and the broad probe beam are simultaneously applied to the single vapor cell. In at least some examples, the method further comprises after the broad probe beam is emitted from the single vapor cell, directing the broad probe beam to a beam splitter configured to split the broad probe beam into a first beam and a second beam, the beam splitter configured to direct the first beam to the photodiode array, the beam splitter configured to direct the second beam to a second photodiode array configured for normalization operations.

Another aspect of the present disclosure relates to a device comprising a plurality of multi-channel atomic magnetometers. Each of the plurality of multi-channel atomic magnetometers comprises a single vapor cell comprising alkali-metal atoms and at least one buffer gas, the at least one buffer gas restricting motion of atomic spins of the alkali-metal atoms to produce a plurality of localized sensing volumes within the single vapor cell, a broad pump beam configured to orient electron spins of the alkali-metal atoms in a direction of the broad pump beam, a broad probe beam configured to measure tilts of electron spins with respect to an initial orientation caused by the broad pump beam, the tilts being produced by interactions between external magnetic fields and the oriented electron spins, and a photodiode array configured to output a plurality of signals, each of the plurality of signals representing tilts of electron spins corresponding to a different sensing volume within the single vapor cell, wherein the plurality of multi-channel atomic magnetometers comprises a first multi-channel atomic magnetometer and a second multi-channel atomic magnetometer, the first multi-channel atomic magnetometer and the second multi-channel atomic magnetometer oriented to detect different external magnetic fields produced by a subject. In at least some examples, the alkali-metal atoms comprise at least one of rubidium, potassium, or cesium. In at least some examples, the at least one buffer gas comprises at least one of helium or nitrogen. In at least some examples, the broad pump beam is circularly polarized, the broad probe beam is linearly polarized, and the broad pump beam and the broad probe beam are simultaneously applied to the single vapor cell. In at least some examples, the plurality of multi-channel atomic magnetometers comprises 25 multi-channel atomic magnetometers. In at least some examples, the vapor cells of the 25 multi-channel atomic magnetometers combined produce 400 localized sensing volumes. In at least some examples, each of the plurality of multi-channel atomic magnetometers further comprises a coil configured to generate a local field.

BRIEF DESCRIPTION OF DRAWINGS

For a more complete understanding of the present disclosure, reference is now made to the following description taken in conjunction with the accompanying drawings.

DETAILED DESCRIPTION

Figure 1:
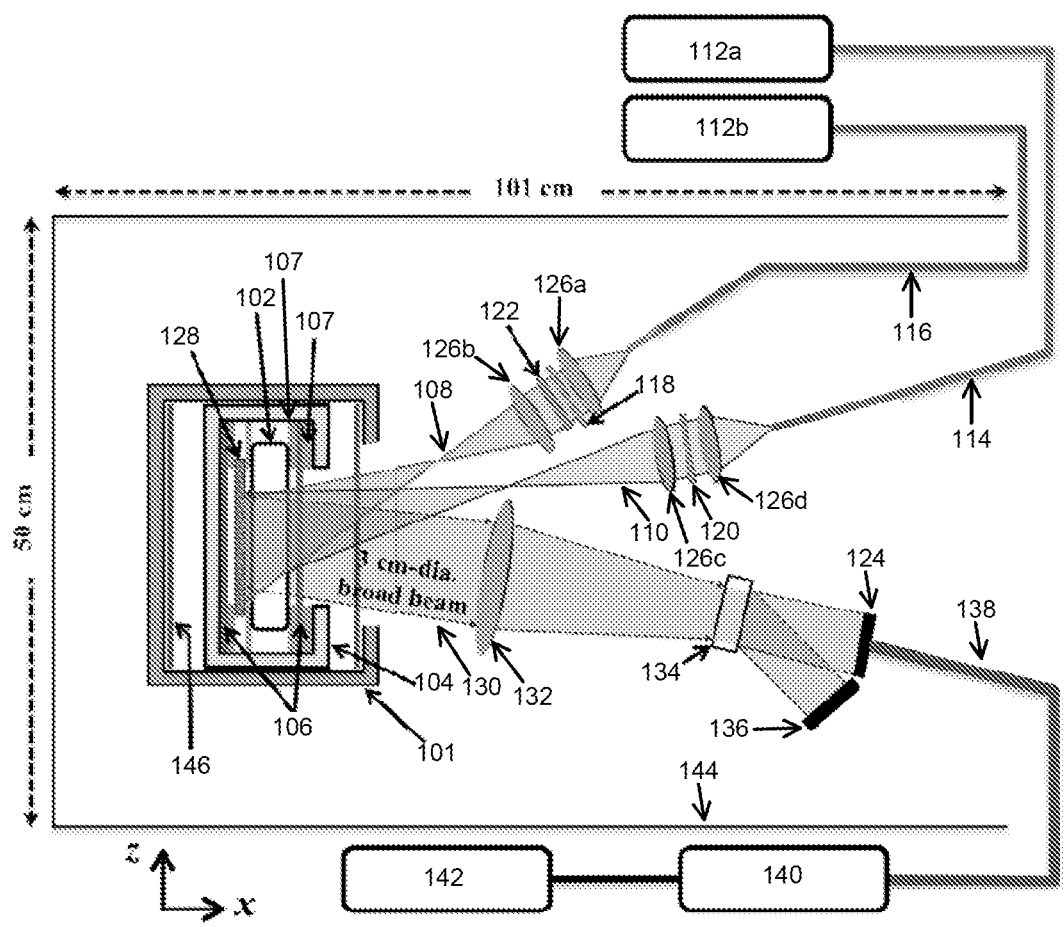
FIG. 1 is a schematic of a single-module multi-channel atomic magnetometer, in accordance with embodiments of the present disclosure.

The present disclosure provides high-sensitivity multi-channel atomic magnetometers. The present disclosure also provides methods for operating multi-channel atomic magnetometers in a single module. The present disclosure also provides an application of multi-channel atomic magnetometers. Moreover, the present disclosure provides devices incorporating a plurality of multi-channel atomic magnetometers.

In at least some examples, a multi-channel atomic magnetometer may be configured as a multi-channel spin-exchange relaxation-free (SERF) atomic magnetometer for low frequency measurement. The multi-channel operation in a single module, of a multi-channel atomic magnetometer of the present disclosure, may be achieved based at least in part on a single large vapor cell, two broad laser beams for pumping and probing, and a photodiode array.

A multi-channel atomic magnetometer of the present disclosure may include a single large alkali-metal vapor cell filled with at least one buffer gas, which restricts motion of alkali-metal atomic spins in the vapor cell, making relatively small internal cell volumes act as multiple independent local sensing channels. In at least some examples, a single-cell multi-channel atomic magnetometer of the present disclosure may provide 16 independent local sensing channels.

A multi-channel atomic magnetometer of the present disclosure may include two broad laser beams overlapping in a vapor cell. A circularly polarized broad pump beam may simultaneously polarize all (or substantially all) atomic spins of alkali-metal atoms in each sensing volume in the vapor cell, and a linearly polarized broad probe beam may simultaneously measure magnetic fields in multiple sensing volumes with, for example, a two-dimensional multi-channel photodiode array. In at least some examples, the magnetic measurement is done via the Faraday effect, a magneto-optical phenomenon referring to the polarization plane rotation of a linearly polarized laser beam in a medium in a magnetic field. The foregoing single large cell and two broad laser beam approach can realize multi-channel magnetic sensing in a single module, reducing the cost of multi-channel atomic magnetometers by an order of magnitude and minimizing the fabrication efforts compared to multi-channel atomic magnetometers composed of multiple separate individual sensing channels (i.e., multiple vapor cells, multiple pump beams, and multiple probe beams).

A multi-channel atomic magnetometer of the present disclosure may include an innovative nearly parallel configuration of laser beams and optical fibers to facilitate multi-channel operation of an atomic magnetometer and sensor positioning, respectively. A multi-channel atomic magnetometer may, in at least some examples, include an oven design based on transparent electrical heaters that achieve uniform temperature across a vapor cell.

A multi-channel atomic magnetometer of the present disclosure may demonstrate magnetic-field sensitivity in each sensing channel of the atomic magnetometer of a few tens femtotesla at low frequency. Because of potential advantages of this approach over known technologies of highly sensitive parallel magnetic detection, it is envisioned that a multi-channel atomic magnetometer of the present disclosure can be used in various applications, such as magnetoencephalography (MEG), magnetocardiography (MCG), magnetic micro-particle imaging, as well as other research, diagnostic, and measurement applications. In MEG, the sensitivity and resolution may be improved and, due to the flexibility in magnetometer positioning, a first size-adjustable pediatric system can be introduced.

A multi-channel atomic magnetometer of the present disclosure uses the spin-exchange relaxation-free (SERF) technique, in which the effects of spin-exchange collisions on spin relaxation are tuned off, thereby dramatically improving sensitivity. Some innovative features of a single-module high-sensitivity multi-channel atomic magnetometer of the present disclosure include, but are not limited to: (1) a large array of sensing channels in a single large alkali-metal vapor cell, which reduces cost by about 10 times; (2) a fiber optic design allowing sensor position to be easily adjustable, which has advantages over the rigid Princeton sensor design referred to above; (3) a parallel beam configuration, which facilitates multi-channel design; (4) a reduced stand-off distance to target magnetic sources with mirror reflection, thereby improving source localization; and (5) a room temperature operation and simple magnetic shield implementation that further reduces cost.

Multi-Channel Atomic Magnetometer

An illustrative multi-channel atomic magnetometer is illustrated in FIG. 1. The multi-channel atomic magnetometer may include a structure 101 within which a vapor cell 102 and other components are located. The structure 101 may be a sturdy, nonfragile material that maintains structural integrity up to at least about 200° C. Moreover, the structure 101 may have low electrical conductivity to reduce magnetic Johnson noise, and a low level of ferromagnetic impurities to reduce magnetic field gradients in the vapor cell. As such, the structure 101 may be comprised of one or more materials such as, for example, acrylic, fiberglass laminate (such as G7 or G10 material), epoxy, non-conductive ceramic, glass, and/or high-temperature plastic. Examples of high-temperature plastics that may be used include, but are not limited to, commercially available plastics sold under the trade names Torlon®, Ryton®, and Vespel®.

The structure 101 may additionally or alternatively be comprised of one or more electrically poorly conductive, high permeability material, such as ferrite or the like. Moreover, inclusion of one or more electrically poorly conductive, high permeability materials in the structure 101 may reduce ambient magnetic noise. Such materials may enable investigation of magnetic field sensitivity of a multi-channel atomic magnetometer.

The structure 101 may include a cell window that enables a broad pump beam 108 and a broad probe beam 110 to enter the vapor cell 102. In at least some examples, the cell window may be circular, although other shapes are envisioned by the present disclosure, and may be dictated by various design choices. In at least some examples, the cell window may be about 4 cm in diameter, although other diameters are envisioned by the present disclosure, and may be dictated by various design choices.

The vapor cell 102 may be a pancake vapor cell in at least some examples. As known in the art, a pancake vapor cell may be cylindrical in that it may have two parallel (or substantially parallel) circular (or substantially circular) surfaces separated by a depth of the vapor cell. However, the present disclosure is not limited to pancake vapor cells. That is, one skilled in the art will appreciate that other non-pancake vapor cells (e.g., cubic vapor cells) may be used.

In at least some examples, the vapor cell 102 may be a "large" vapor cell. As used herein, a "large vapor cell" refers to a few cm-scale vapor cell that enables simultaneous magnetic sensing of a sufficiently large area of a subject.

The vapor cell 102 may include alkali-metal atoms. Example alkali-metal atoms that may be included in the vapor cell 102 include, but are not limited to, Group I metals such as potassium (K, atomic number 19), rubidium (Rb, atomic number 37), and cesium (Cs, atomic number 55). In at least some examples, the vapor cell 102 may include more than one type of alkali-metal atoms. For example, the vapor cell 102 may include both rubidium and potassium atoms, giving some advantages of polarizing atomic spins.

The vapor cell 102 may include at least one buffer gas configured to restrict motion of alkali-metal atomic spins in the vapor cell, thereby making relatively small internal cell volumes act as multiple independent local sensing channels. Example buffer gases that may be included in the vapor cell 102 include helium (He, atomic number 2) and xenon (Xe, atomic number 54). In at least some examples, it may be beneficial to include helium in the vapor cell 102 as helium has a minimal spin destruction rate, thereby leading to a highly sensitive atomic magnetometer.

The vapor cell 102 may include at least one quenching gas configured to quench excited-state alkali-metal atoms and reduce diffusion of alkali-metal atoms. An example quenching gas that may be included in the vapor cell 102 is nitrogen (N, atomic number 7). It may be beneficial to use nitrogen as a quenching gas when rubidium is included in the vapor cell 102 as nitrogen may be produced in decomposition of rubidium azide ($RbN_3$).

The vapor cell 102 may include various amounts of buffer gas(es). In at least some examples, the amount of buffer gas(es) included in the vapor cell 120 may be selected to reduce spin destruction from diffusion of alkali-metal atoms to the walls of the vapor cell 102, and to realize multi-channel operation. A higher density of buffer gas(es) may further reduce diffusion of alkali-metal atoms, but the vapor cell 102 may become dangerous and manipulation may require use of a face mask.

In at least some examples, the total amount of buffer gas(es) that may be included in the vapor cell 102 is about 1 amagat. In at least some examples, about 1 atmosphere of buffer gas(es), from about 600 torr to about 760 torr, may be included in the vapor cell 102.

The vapor cell 102 may be sized based differently depending on implementation parameters. By way of example, and not limitation, the vapor cell 102 may have a 6 cm diameter, 2 cm thickness, and 1 mm wall thickness.

The vapor cell 102 may be produced using a glass cell structure. In at least some examples, a commercially available glass cell structure may be used, such as one produced by Precision Glassblowing, Inc. (Colorado, USA), may be used.

In one method of producing the vapor cell 102, a glass cell structure may be connected to a vacuum system for filling with alkali-metal atoms. One method is to chase the alkali-metal atoms from one part in a vacuum manifold to the glass cell structure. After the alkali-metal atoms are added to the glass cell structure, one or more buffer gases can be introduced into the glass cell structure. Thereafter, a thin tubing, connecting the glass cell structure to the vacuum system may be heated (e.g., with a torch) and separated from the glass cell structure, thereby sealing the glass cell structure, resulting the vapor cell 102 described herein.

Another method of producing the vapor cell 102 is based on microfabrication techniques, for example by etching glass and anodic bonding by applying electrical voltages. This method may be used to produce a vapor cell 102 including rubidium azide, which can lead to rubidium and nitrogen (quenching gas) being included in the vapor cell 102.

In at least some examples, the vapor cell 102 may be wholly or partially surrounded by a heat insulating material 104, which may be located within the structure 101. In at least some examples, the heat insulating material 104 may be located proximate to an entirety of the external surface of the vapor cell 102, except for a portion of the external surface of the vapor cell 102 located in line with a cell window of the structure 101.

In at least some examples, the heat insulating material 104 may be microporous or aerogel. Example microporous or aerogel materials that may be included in the heating insulating material 104 include, but are not limited to, fiberglass and foams.

A thickness of the heat insulating material 104 may depend on implementation. In at least some examples, the heat insulating material 104 may be about 1 cm thick.

In order to obtain a sufficient number density of alkali-metal atoms, and to operate the multi-channel atomic magnetometer in the SERF regime, the vapor cell 102 may be electrically heated using one or more heaters 106. In at least some examples, the one or more heaters 106 may be one or more transparent Pyrex wire heaters. In at least some examples, the one or more transparent wire heaters may be made of high-resistance non-magnetic thin tungsten wire. When the vapor cell 102 is a pancake vapor cell, the one or more transparent Pyrex wire heaters, in at least some examples, may be located within the structure 101 and proximate to both circular (or substantially circular) surfaces of the pancake vapor cell.

The vapor cell 102 may be heated, by the one or more transparent Pyrex wire heaters, to various temperatures depending on vapor cell composition. For example, when the vapor cell 102 comprises rubidium, the vapor cell 102 may be heated to about 160° C. For further example, when the vapor cell 102 comprises potassium, the vapor cell 102 may be heated to about 200° C. In another example, when the vapor cell 102 comprises cesium, the vapor cell 102 may be heated to about 100° C.

In at least some examples, one or more heaters 106 may abut or be positioned proximate to a first surface of the vapor cell 102, and one or more other heaters 106 may abut or be positioned proximate to a second surface (parallel or substantially parallel to the first surface) of the vapor cell 102 (as illustrated in FIG. 1). One skilled in the art will appreciate, however, that one or more heaters 106 may abut or be positioned proximate to one or more other surfaces of the vapor cell 102.

In at least some examples, electrical current of the heater(s) 106 may be periodically turned off during measurements to reduce magnetic noise from the heater(s) 106 current. Current of the heater(s) 106 may be switched between on and off states using an electronic switch. AC current alternatively can be applied to the heater(s) 106 without the need of switching off the heater(s) 106 current.

A heater 106 may be positioned proximate to a surface of the vapor cell 102 using one or more spacers 107. Such provides an area for still air between the heater 106 and the vapor cell 102. The spacer(s) 107 may be a glass cloth silicone spacer, such as a G7 spacer manufactured by Vanderveer Industrial Plastics, Placentia, Calif., USA.

The broad pump beam 108 and/or the broad probe beam 110 may be provided from one or more lasers (112a/112b). Example types of lasers that may source the broad pump beam 108 and/or the broad probe beam 110 include, but are not limited to, distributed feedback (DFB) lasers, external-cavity diode lasers (ECDLs), and vertical-cavity surface-emitting lasers (VCSELs) that minimize optical noise and achieve stable operation. In at least some examples, the broad pump beam 108 and broad probe beam 110 may be sourced from the same type of lasers. In at least some other examples, the broad pump beam 108 and the broad probe beam 110 may be sourced from different types of lasers.

In examples where the vapor cell 102 includes rubidium atoms, the broad pump beam 108 and the broad probe beam 110 may both be sourced from 30 mW 794 nm DFB lasers. Such DFB lasers may be obtained from Eagleyard Photonics (Berlin, Germany). A DFB laser may be operated and controlled by a laser diode controller (e.g., a SRS LDC501 laser diode controller or the like).

In at least some examples, the power of a laser may be increased to improve field sensitivity of a multi-channel atomic magnetometer. For example, 0.5 W DFB lasers plus tapered amplifier systems may be used.

A first laser 112a may be coupled to a first optical fiber 114. A second laser 112b may be coupled to a second optical fiber 116. In at least some examples, one or both of the optical fibers (114/116) may be obtained from a commercially available source such as, but not limited to, the Amphenol Cables on Demand (New York, USA).

The optical fibers (114/116) may be of various lengths. In at least some examples, the each of the optical fibers (114/116) may be about 3 meters long. Fiber optic coupling of the lasers (112a/112b) enables a flexible magnetometer position useful in various applications, such as magnetoencephalography (MEG) and magnetocardiography (MCG).

The broad pump beam 108 may be circularly polarized. For example, the laser beam that exits the second optical fiber 116 may be passed through a polarizer 118, and the resulting polarized beam may be passed through a quarter-wave plate 122, resulting in the circularly polarized broad pump beam 108. As used herein, a "circularly polarized" broad pump beam 108 is light having two perpendicular electromagnetic plane waves of equal amplitude and 90° difference in phase. A circularly polarized broad pump beam 108 may be left-circularly polarized or right-circularly polarized.

The broad probe beam 110 may be linearly polarized. For example, the laser beam that exits the first optical fiber 114 may be passed through a polarizer 120, resulting in the linearly polarized broad probe beam 110. As used herein, a "linearly polarized" broad probe beam 110 is light having a planar electromagnetic wave.

The broad pump beam 108 and the broad probe beam 110 may be directed such that, as the broad pump beam 108 and the broad probe beam 110 enter the vapor cell 102, the broad pump beam 108 and the broad probe beam 110 are parallel (or substantially parallel). Such may ensure sufficient overlap of the broad pump beam 108 and the broad probe beam 110 within the vapor cell 102. The foregoing helps prevent the broad pump beam 108 from entering a photodiode array 124, thereby avoiding extra background noise from the broad pump beam 108.

As used herein, a "broad" beam may refer to a laser beam having a diameter of at least about 3 cm when the laser beam first enters the vapor cell 102. A desired at least about 3 cm diameter may be obtained using one or more lenses (such as the lenses 126a/126b/126c/126d described herein).

The broad pump beam 108 and the broad probe beam 110 may be identical (or substantially similar) in diameter when the broad pump beam 108 and the broad probe beam 110 first enter the vapor cell 102. In an example, the broad pump beam 108 and the broad probe beam 110 may each be about 3 cm in diameter when the broad pump beam 108 and the broad probe beam 110 first enter the vapor cell 102.

In at least some examples, the identical (or substantially similar) diameters of the broad pump beam 108 and the broad probe beam 110 may be produced by one or more lenses 126. The one or more lenses 126 may be located proximate to the polarizers (118/120). For example, each polarizer (118/120) may be located between two lenses 126 to produce the broad pump beam 108 and the broad probe beam 110 having identical (or substantially similar) diameters.

Figure 2:
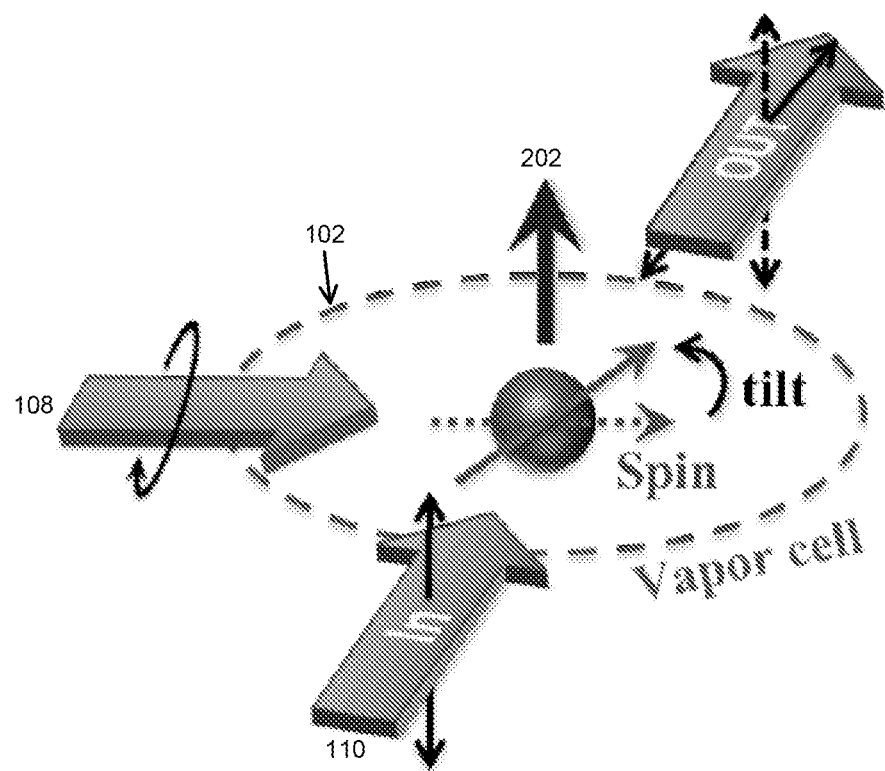
FIG. 2 is a conceptual diagram illustrating a basic principle of an atomic magnetometer, in accordance with embodiments of the present disclosure.

FIG. 2 illustrates the basic principle of used in a multi-channel atomic magnetometer of the present disclosure to detect magnetic fields. The broad pump beam 108 and the broad probe beam 110, in at least some examples, are sent to overlap in the vapor cell 102. It should be noted that while significant sensitivity may be expected when the broad pump beam 108 and the broad probe beam 110 are in the conventional orthogonal beam configuration, examples of the present disclosure may use a nearly parallel beam configuration to facilitate a multi-channel design and offer simplifications as described herein.

The broad pump beam 108 (which may be circularly polarized as output from the polarizer 118 and the quarter-wave plate 122), may orient electron spins of alkali-metal atoms in the vapor cell 102 along the broad pump beam 108's direction. Broad pump beam 108 and vapor cell 102 configurations may be selected such that the broad pump beam 108's interaction with the vapor cell 102 may result in a significant number density of almost 100% polarized electron spins in the vapor cell 102.

Interaction between an external magnetic field 202 (e.g., one produced by a subject's brain, heart, muscles, nerves in extremities, lungs, digestive tract, etc.) and the oriented electron spins may tilt the spin orientation of the electrons by an angle proportional to the external magnetic field 202's magnitude. The tilt angle (and thus the magnetic field 202) may be measured by the broad probe beam 110. More specifically, in at least some examples, the tilt angle (and thus the magnetic field 202) may be measured by the effect of the tilted spins on a polarization plane rotation of a linearly polarized broad probe beam 110. This is known as the Faraday effect.

As used herein, the term "subject" may refer to a vertebrate mammal including but not limited to a human, non-human primate (e.g., monkey), mouse, rate, guinea pig, rabbit, cow, dog, cat, horse, goat, bird, reptile, or fish. A subject may be a domesticated animal, a wild animal, or an agricultural animal. Accordingly, teachings of the present disclosure may be used with respect to human and non-human subjects. For instance, teachings of the present disclosure can be used in veterinary applications (e.g., in zoos, reserves, farms, in the wild, etc.) as well as in human prevention and treatment regimens.

Referring back to FIG. 1, a mirror 128 may abut or be positioned proximate to a rear surface of the vapor cell 102, with the rear surface corresponding to a surface the broad pump beam 108 and the broad probe beam 110 positioned closest to a subject during measurements. The mirror 128 may be positioned within the structure 101.

The mirror 128 may be positioned to reflect the broad pump beam 108 and the broad probe beam 110 after the broad pump beam 108 and the broad probe beam 110 pass through the vapor cell 102 (reflected broad pump beam not shown in FIG. 1 for purposes of clearer illustration). For example, the mirror 128 may be located proximate to an exterior surface, of the vapor cell 102, that is parallel or substantially parallel to an exterior surface of the vapor cell 102 that is first contacted by the broad pump beam 108 and the broad probe beam 110. Such positioning of the mirror 128 may reduce a stand-off distance between target magnetic sources and an active volume of the atomic magnetometer, which improves the resolution of the atomic magnetometer. Improvement of the resolution is significant in some applications, such as MEG.

In at least some examples, the mirror 128 may be configured to reflect the broad pump beam 108 and the broad probe beam 110 back through at least a portion of the vapor cell 102, thereby allowing the broad pump beam 108 and the broad probe beam 110 to each pass through the vapor cell 102 twice, doubling the atomic magnetometer's signal and doubling a pumping rate. In at least some examples, the reflected broad probe beam 130 may have an about 3 cm diameter.

Although the broad pump beam 108 is reflected by the mirror 128, the broad pump beam 108 may not enter the photodiode array 124.

After being reflected by the mirror 128, the broad probe beam 130 may be reshaped by a lens 132. The lens 132 may have a diameter selected to reshape the broad probe beam 130 to have a diameter that matches (or substantially matches) a dimension of a polarizing beam splitter 134 and the photodiode array 124. In an example, the lens 132 may have a diameter of about 5 cm and the polarizing beam splitter 134 may be a cube polarizing beam splitter having a length of about 2.5 cm, and the photodiode array 124 may be a square photodiode array having a side length of about 0.8 cm.

The polarizing beam splitter 134 splits the reshaped probe beam, output from the lens 132, into two beams. One of the beams may be directed to a photodiode array 136 and the other beam may be directed to a photodiode array 124. As known in the art, a photodiode array is a linear array of photodiodes on an integrated circuit (IC) chip. When light hits a photodiode array, the light creates electron-hole pairs, and the electrons migrate to nearest PIN junctions. After a fixed amount of time, the charge at each element may be sequentially read to generate analog signals (i.e., currents) representing the charges detected.

In at least some examples, the photodiode array 124 may be a 0.8×0.8 cm$^2$ 4×4 photodiode array. An example photodiode array that may be implemented includes a PIN-4× 4D, manufactured by OSI Optoelectronics (Hawthorne, Calif., USA).

Various photodiode array formats may be used. It is also noted that the photodiode array format correlates to the sensing channels of the multi-channel atomic magnetometer. For example, a 4×4 photodiode array produces 16 sensing channels, a 5×5 photodiode array produces 25 sensing channels, etc. While various photodiode arrays may be used, the number of sensing channels may nonetheless be limited based on the size of the vapor cell 102.

Signals output by the photodiode array 136 may be used for normalization. Normalization may include subtracting signals output by the photodiode array 136 and signals output by the photodiode array 124. In a multi-channel design, such subtraction may not be necessary since multi-channel systems generally allow for removing intensity fluctuation noise by subtracting signals from different channels in addition to, for example, gradiometric subtraction of common-mode magnetic noise and pump laser noise.

While the above describes use of photodiode arrays, ordered fiber bundles may be used in at least some examples to collect magnetic images and project same to photodiodes that are not necessarily arranged in a matrix. A camera may be used for high-resolution imaging.

Figure 3:
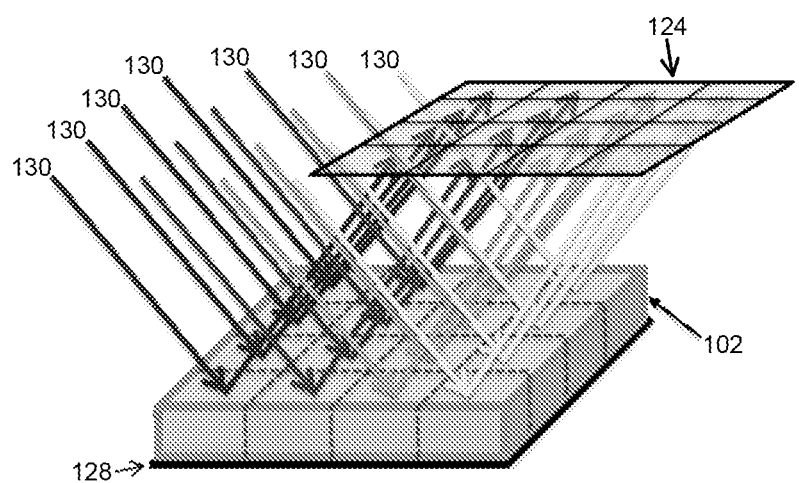
FIG. 3 is a conceptual diagram illustrating a 16-channel atomic magnetometer, in accordance with embodiments of the present disclosure.

FIG. 3 illustrates how broad beam reflection by the mirror 128 and implementation of a 4×4 photodiode array 124 may generate a 16-channel atomic magnetometer using a single vapor cell 102. As described, the vapor cell 102 may be filled with at least one buffer gas. The buffer gas(es) restrains motion of alkali-metal atoms in the vapor cell 102, thereby producing multiple individual local field sensing volumes in the vapor cell 102. Specifically, high buffer gas pressure may inhibit diffusive motion of the alkali-metal atoms and allow the alkali-metal atoms in different locations of the vapor cell 102 to act as local sensing volumes in the vapor cell 102. Keeping the buffer gas constant, signal outputs from the photodiode array may determine the number of independent sensing channels.

A magnetic instance at each sensing volume may be converted to an optical representation in the broad probe beam 130. The optical representations are converted to analog signals by the photodiode array 124. The reflection of beams by the mirror 128 minimizes a stand-off distance to a target magnetic subject, improving resolution of the magnetometer, and doubles magnetic signals.

Referring back to FIG. 1, the analog signals (i.e., currents) output by the photodiode array 124 may be transmitted, via a cable bundle 138 or the like, to an amplifier 140. In at least some examples, the cable bundle 138 may include a separate commercially available coaxial cable for each sending channel of the photodiode array. For example, the cable bundle 138 may include 16 separate commercially available coaxial cables when a 4×4 photodiode array (corresponding to 16 sensing channels) is implemented. In at least some examples, ribbon type wires may be used, but cross-talk may be an issue.

In at least some examples, the amplifier 140 may be a transimpedance amplifier, although other types of amplifiers may be used. As known in the art, a transimpedance amplifier converts current to voltage.

The amplifier 140 may simultaneously receive multiple analog current signals from the photodiode array 124. The amplifier 140 may simultaneously receive as many analog current signals as there are individual local field sensing volumes in the vapor cell 102. For example, when the vapor cell 102 is configured with 16 individual local field sensing volumes, the photodiode array 124 may simultaneously output 16 different current signals, which the amplifier 140 may simultaneously receive and convert into 16 different analog voltage signals. While one amplifier is described and illustrated, one skilled in the art will appreciate that more than one amplifier may be implemented.

The analog voltage signals, output by the amplifier 140, may be sent to a data acquisition module 142. In at least some examples, the data acquisition module 142 may be a 24-bit analog-to-digital converter such as, but not limited to, the data acquisition module PXIe-4497, manufactured by National Instruments, United States.

The data acquisition module 142 may be configured to simultaneously produce as many digital signals as there are analog voltage signals output by the amplifier 140. For example, when the amplifier 140 is configured to simultaneously output 16 different analog voltage signals, the data acquisition module 142 may be configured to simultaneously output 16 digital signals.

The data acquisition module 142 may be configured to implement various sampling rates. In at least some examples, the data acquisition module 142 may be configuration to operate at a sampling rate of about 100 kHz. A sufficiently high sampling rate may be selected to avoid unwanted artifacts, such as aliasing of high frequency noise. High frequency noise refers to magnetic noise above about 10 kHz. This may be so even if performance of the atomic magnetometer is evaluated at low frequency (e.g., between about 10 Hz and about 100 Hz). In at least some examples, analog signals may be recorded by the data acquisition module 142 when current of the heaters 106 is turned off.

Various commercially available programs may be used to record digital signals output by the data acquisition module 142 such as, but not limited to, a LabView program.

Various components of a multi-channel atomic magnetometer according to the present disclosure may be located within a magnetic shield 144. The magnetic shield 144 may be composed of high permeability μ-metal or the like. In an example, the magnetic shield 144 may be a single-layer, open cylindrical μ-metal shield.

As illustrated in FIG. 1, all of the above described components of the multi-channel atomic magnetometer may be located within the magnetic shield 144 except the lasers (112a/112b), the amplifier 140, and the data acquisition module 142. A multi-channel atomic magnetometer of the present disclosure may be positioned, with respect to a subject, with high flexibility based at least in part on the lasers (112a/112b), located outside of the magnetic shield 144, being connected to components inside the magnetic shield 144 via flexible optical fibers (114/116).

The magnetic shield 144 may be configured to have various dimensions based on various considerations (e.g., size of internal components, cost, etc.). In examples where the magnetic shield 144 is cylindrical, the magnetic shield 144 may have a diameter of about 50 cm, about 9 cm, or some other diameter. Moreover, when the magnetic shield 144 is cylindrical, the magnetic shield 144 may have a length of about 101 cm, about 19 cm, or some other length.

Application of Magnetic Field when Using Atomic Magnetometer

Figure 4:
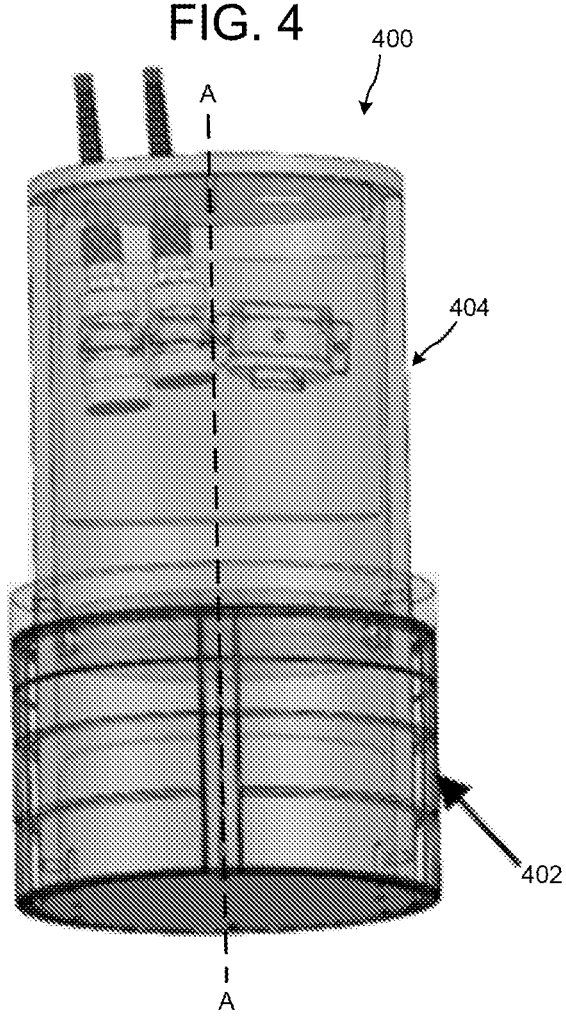
FIG. 4 is a side view of an example compact multi-channel atomic magnetometer including a coil system, in accordance with embodiments of the present disclosure.

In at least some examples, it may be beneficial (or even required) to apply one or more small magnetic fields at some angle with respect to an axis of a multi-channel atomic magnetometer in order to achieve the SERF regime according to the present disclosure. One or more coils 402 may be configured as part of a multi-channel atomic magnetometer 400 (for example as illustrated in FIG. 4). The coil(s) 402 may be coupled to an outer surface of a housing 404 of the multi-channel atomic magnetometer 400. The housing 404 may be provided for laser safety. For example, as illustrated in FIG. 4, a multi-channel atomic magnetometer 400 may be cylindrical, and the coil(s) 402 may be coupled to an end portion of the cylindrical housing 404 such that the coil(s) 402 abuts or is proximate to an outer surface of the end portion of the cylindrical housing 404.

In at least some examples, the coil(s) 402 may be made of commercially sourced Litz wire. In at least some examples, the commercially sourced Litz wire may be wound on a coil former.

The coil(s) 402 may be configured to apply one or more small magnetic fields at one or more angles (e.g., along x, y, and/or z axes) with respect to an axis of the multi-channel atomic magnetometer 400. As used herein, a "small magnetic field" may refer to a magnetic field around pT to nT.

When the multi-channel atomic magnetometer 400 has a cylindrical housing 404, the axis (dashed line A-A illustrated in FIG. 4) may extend from a center point of a first circular or oval terminal surface of the cylindrical housing 404 to a center point of a second circular or oval terminal surface of the cylindrical housing 404.

In at least some examples, small magnetic fields may be generated from a three-axis coil system 402 to compensate ambient magnetic fields at the location of the vapor cell to achieve the SERF regime as well as optimize the multi-channel atomic magnetometer 400 to the sensitivity of the field component in a certain direction.

Array of Multi-Channel Atomic Magnetometers

A plurality of multi-channel atomic magnetometers, as described above, may be configured in an array. For example, a plurality of multi-channel atomic magnetometers described herein may be configured as part of a compact, portable, flexible MEG helmet. That is, a plurality of multi-channel atomic magnetometers of the present disclosure may be configured to measure magnetic fields produced by a subject's brain's electrical currents.

Figure 5:
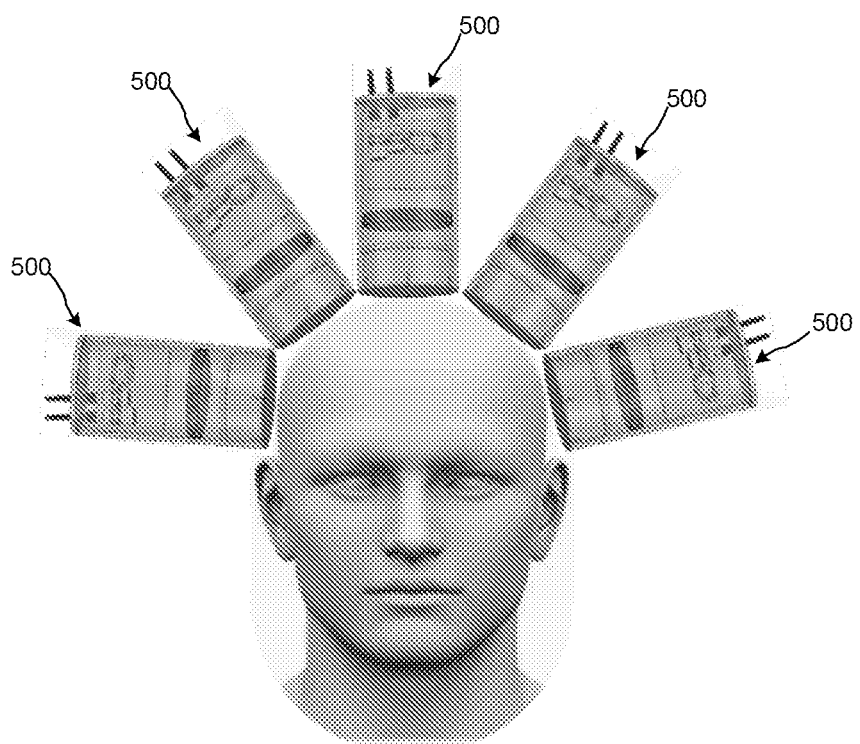
FIG. 5 is a conceptual illustration of a plurality of compact multi-channel atomic magnetometers configured as a magnetoencephalography (MEG) helmet, in accordance with embodiments of the present disclosure.

As illustrated in FIG. 5, a plurality of multi-channel atomic magnetometers 400 may be flexibly positioned about a subject's head to simultaneously detect magnetic fields produced by the sufficiently large area of the subject's brain. Simultaneous imaging of the subject's brain activity on a large area of the brain will accelerate MEG imaging to reduce the procedure time and subject fatigue. While FIG. 5 illustrates the use of 5 multi-channel atomic magnetometers 400, one skilled in the art will appreciate that any number of atomic magnetometers may be configured as part of a MEG helmet depending on various design considerations, such as subject head size, cost, etc.

In at least some examples, 25 multi-channel atomic magnetometers may be configured as part of a single MEG helmet. If each of the 25 multi-channel atomic magnetometers are configured with 16 independent local field sensing volumes, the 25 multi-channel atomic magnetometer MEG helmet may implement 400 sensing channels. This is highly beneficial as compared to implementing 400 separate individual atomic magnetometers, which would be highly expensive to manufacture and tune.

The size of each multi-channel atomic magnetometer of a MEG helmet may be minimized to increase the number of multi-channel atomic magnetometers that may be implemented as part of the MEG helmet, thereby increasing sensitivity of the MEG helmet. The broad pump beam 108 and the broad probe beam 110 may be parallel (or substantially parallel) when entering the vapor cell 102, thereby ensuring good overlap inside the vapor cell 102 and reducing gaps between multi-channel atomic magnetometers combined in a non-cryogenic MEG helmet (as shown in FIG. 5).

The MEG helmet may be configured such that multi-channel atomic magnetometer positions may be individually, and independently, adjusted to reduce stand-off distance to the surface of the subject. This is beneficial because surfaces of subjects may have different shapes and sizes.

Moreover, such adjustment of multi-channel atomic magnetometer positions facilitates various subject positions during measurements. This may be contrasted to the Princeton design by the Romalis's group, which relies on a large cell rigidly fixed in a certain position, preventing flexible sensor positioning.

Another advantage of a MEG helmet according to the present disclosure is that such a MEG helmet is portable and can be moved with the subject. This prevents experiments from being limited to horizontal positions, such as supine.

Because the multi-channel atomic magnetometers 400 in a MEG helmet of the present disclosure may be tilted at varying angles, one common magnetic field may not be optimal. Coils 402, of multi-channel atomic magnetometers 400 as described above with respect to FIG. 4, may make it possible to generate local magnetic fields for better optimization of the multi-channel atomic magnetometers 400. Because only small magnetic fields are needed, the effect of the coil(s) 402 of one multi-channel atomic magnetometer 400 on one or more neighboring multi-channel atomic magnetometers 400 is insignificant. Also, because multiple averaging is involved in MEG experiments, it is possible to activate multi-channel atomic magnetometers 400 of MEG helmet in two steps so neighboring multi-channel atomic magnetometers are not active at the same time. Such may minimize the effect of the small magnetic fields from one multi-channel atomic magnetometer to others. While this may lead to 2× longer measurement times, such may be offset by the increase in sensitivity of atomic magnetometer measurements.

EXAMPLES

Sensitivity Measurements

The magnetic field sensitivity of a prototype 16-channel atomic magnetometer was investigated by placing a rubidium vapor cell inside a 14×14×14 cm$^3$ ferrite cube box, which was placed into a single layer open μ-metal cylindrical shield (as shown in FIG. 1). These two shields sufficiently suppressed external DC field and magnetic noise. However, in order to achieve the SERF regime, a three-axis field-compensating coil system (marked as 146 in FIG. 1) was installed inside the ferrite shield to remove residual field inside the ferrite shield. The prototype 16-channel atomic magnetometer was optimized to the sensitivity of the field component in they direction (with reference to the legend in FIG. 1) by applying optimized DC offset fields using the three-axis field compensating coil system. To convert output voltage noise spectra of the photodiode array to the magnetic field noise spectra, voltage signals were recorded for about 1 s and a calibration magnetic field at about 30 Hz was applied in they direction. The constant amplitude of the calibration field was about 36 pT/Hz$^{1/2}$ at a setting of a LabView program where the voltage spectra were recorded.

Figure 6:
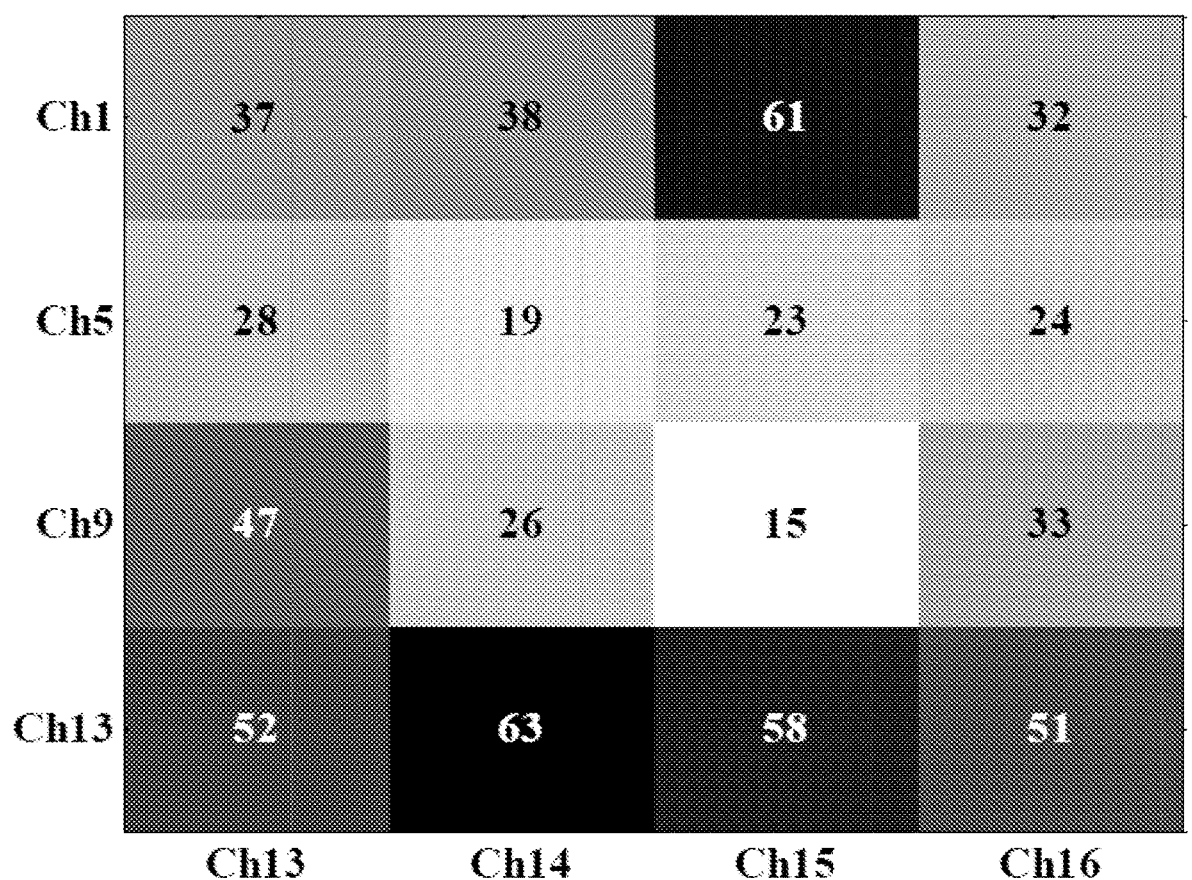
FIG. 6 illustrates example magnetic field sensitivities of 16 sensing channels of a 16-channel atomic magnetometer, in accordance with embodiments of the present disclosure.

FIG. 6 illustrates measured field sensitivities in 16 sensing channels of the prototype atomic magnetometer, which range from 15 to 63 fT/Hz$^{1/2}$. The spread in the sensitivity can be attributed to intensity non-uniformity of the broad pump beam and broad probe beam, and magnetic field gradients in the vapor cell, while the overall sensitivity decrease can be attributed to insufficient laser power. Because a single-channel atomic magnetometer with two about 1 cm size pump and probe beams (not broad beams) and a laser power of 30 mW has a 10 fT/Hz$^{1/2}$ sensitivity at low frequency, it is anticipated that, by increasing a laser power to about 16×30=480 mW, making intensity of broad laser beams uniform across the vapor cell, and by removing magnetic field gradients with gradient-compensating coils, sensitivity may improve to about 10 fT/Hz$^{1/2}$ for all 16 sensing channels.

Figure 7:
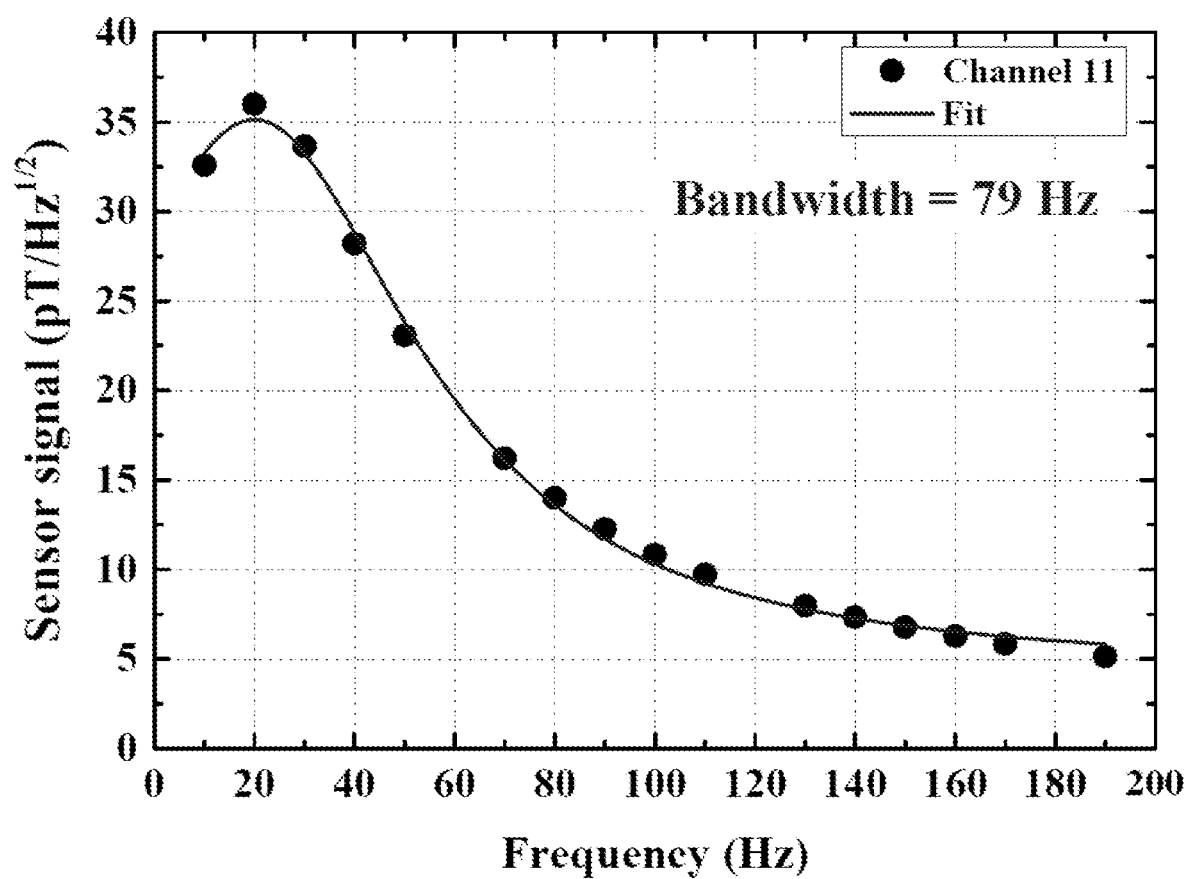
FIG. 7 is a graph illustrating a frequency response of a channel 11 of a 16-channel atomic magnetometer, in accordance with embodiments of the present disclosure.

FIG. 7 illustrates a frequency response of channel 11 of the prototype 16-channel atomic magnetometer. Channel 11 was chosen because it exhibited the highest sensitivity as illustrated in FIG. 6. The frequency response was obtained by applying a constant magnetic field at different frequencies below about 200 Hz. The solid line in FIG. 7 shows a Lorentzian fit to:

$$f(v)=a+b/[4(v-v_0)^2+y^2],$$

where:
v=the frequency of the applied field; and
a, b, v$_0$, and y=free fitting parameters.

The fit gives the bandwidth of the sensing channel y equal to about 79 Hz. The other channels of the atomic magnetometer were observed to have almost the same bandwidth with about 10 Hz variation.

Figure 8:
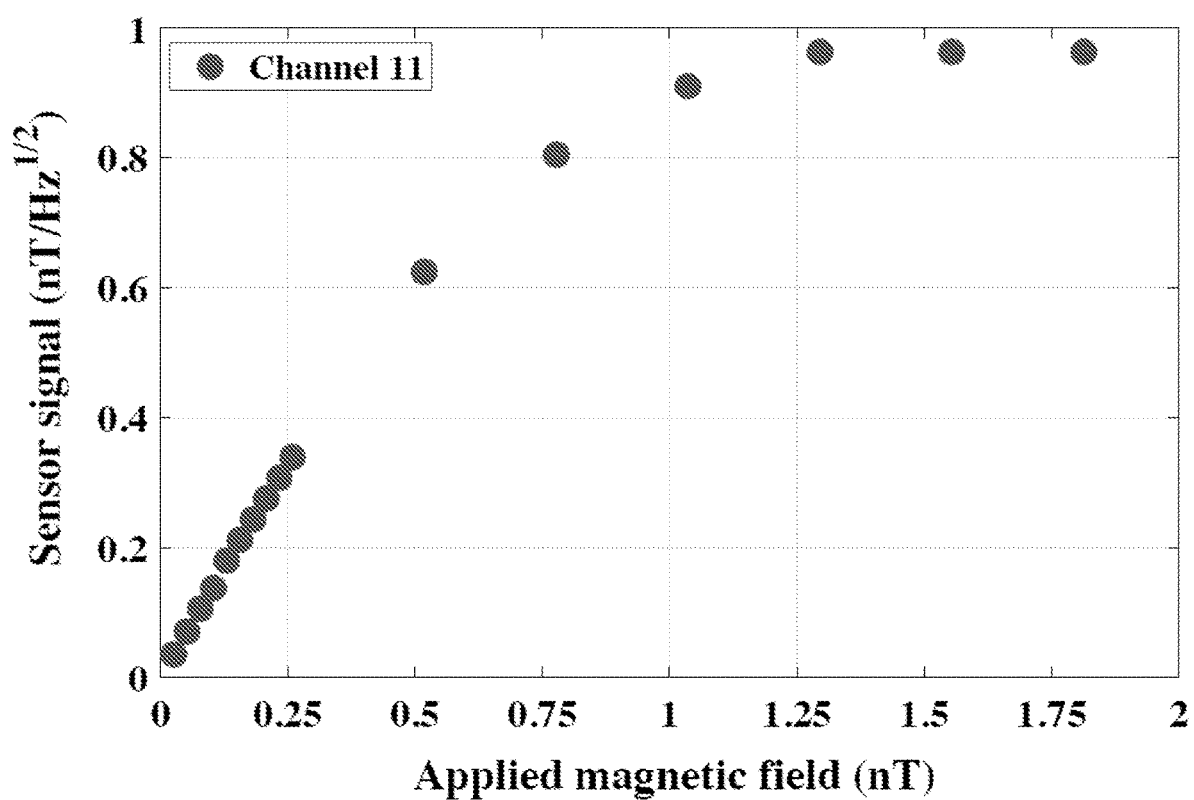
FIG. 8 is a graph illustrating a dynamic range of a channel 11 of a 16-channel atomic magnetometer, in accordance with embodiments of the present disclosure.

A dynamic range of channel 11 of the prototype 16-channel atomic magnetometer was investigated by increasing the amplitude of the applied field (as illustrated in FIG. 8). It was found that the atomic magnetometer linearly responded to a magnetic field up to about 0.5 nT, and saturated at about 1.25 nT.

Figure 9:
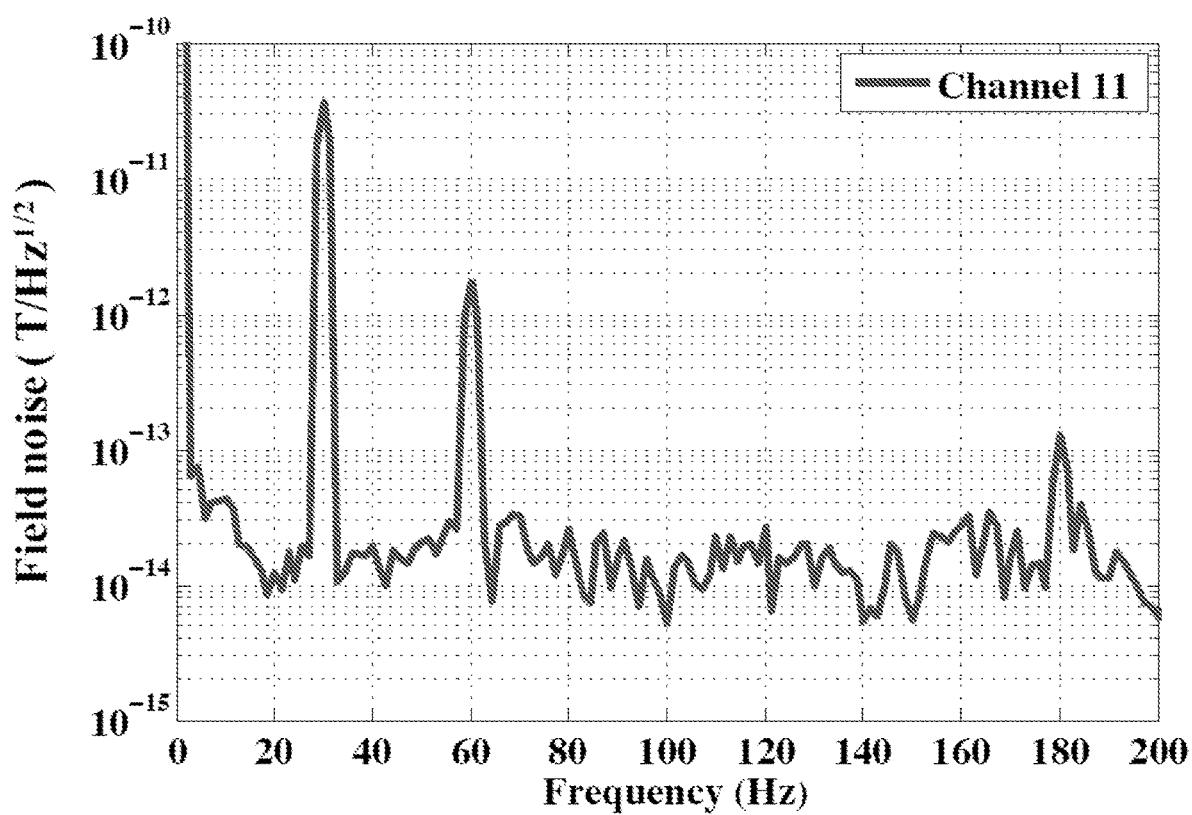
FIG. 9 is a graph illustrating a magnetic field sensitivity of a channel 11 of a 16-channel atomic magnetometer, in accordance with embodiments of the present disclosure.

A magnetic field noise spectrum of channel 11, which was calibrated by a ratio of the amplitude of the applied calibration field to a measured voltage amplitude at the calibration frequency, is illustrated in FIG. 9. The first peak at 30 Hz is due to the applied calibration field, while the second peak at 60 Hz is due to facility power noise. The field sensitivity of the magnetometer, limited by magnetic noise, was about 15 fT/Hz$^{1/2}$.

Magnetocardiography (MCG) Measurements

A 16-channel atomic magnetometer was designed as follows: a rubidium vapor cell and optic elements were placed inside a portable wooden enclosure; only nonmagnetic materials were used; magnetic shielding was implemented by placing the enclosed 16-channel atomic magnetometer inside a two-layer magnetically shield room (MSR) with additional compensation coils (B$_x$, B$_y$, B$_z$, dB$_x$/dx, dB$_y$/dy, and dB$_z$/dz) added around the vapor cell to suppress residual magnetic fields at the location of the vapor cell and tune the magnetometer. The three orthogonal coils were one-turn square Helmholtz coils with 12 cm sides, while the gradient coils were one-turn square anti-Helmholtz coils with 12 cm sides. The magnitudes of compensation fields applied when tuning the atomic magnetometer were B$_x$=B$_x$=19 nT, B$_z$=39 nT, and dB$_x$/dx=dB$_y$/dy, =dB$_z$/dz=1 pT/m.

The vapor cell was positioned at the end of the wood enclosure to reduce the stand-off distance to a subject's chest. The atomic magnetometer was optimized to be sensitive to the field component in the z direction by applying a static offset field using the field component coil for the z direction.

Probe and pump lasers coupled to the 16-channel atomic magnetometer optic components through fibers were also completely surrounded by a plastic enclosure for laser safety. A 16-channel photodiode array was connected to a 24-bit 16-channel data acquisition system through a 16-channel transimpedance amplifier located inside the MSR. The lasers, the data acquisition system, and supporting electronics such as laser controllers were located outside the MSR to remove the effect of their significant magnetic noise on the atomic magnetometer. Only the fibers and cables for the compensation coils and the photodiode outputs passed through a port of the MSR wall. 16 individual output voltage signals of the photodiode array were simultaneously recorded at a sampling rate of 10 kHz using the data acquisition system. The voltage signals were converted to magnetic field signals by using a known calibration magnetic field in the z direction.

The sensitivity in each channel of the enclosed 16-channel atomic magnetometer inside the MSR was measured to a few tens of femto-Tesla, similar to that in the sensitivity tests as shown in FIG. 6, while the peaks at 60 Hz were highly suppressed inside the MSR. The dynamic range and the bandwidth of the 16 sensing channels were measured to be about 0.5 nT and about 80 Hz, respectively. The spatial resolution was determined by the size of each local sensing volume, and hence, it was roughly about 1 cm. The channel cross-talk in the atomic magnetometer was not important because the spin-state information of each rubidium atom could diffuse only over around 2 mm, considering the diffusion coefficient of rubidium atoms in the given pressure of helium buffer gas, D=0.42 cm$^2$/s, and the transverse relaxation time, $T_2$=30 ms, based on the diffusion equation, =$\sqrt{4DT_2}$, where r is the propagation radius of the spin-state information. The propagation radius was much smaller than the spacing between the adjacent channels. The sensitivities in the 16 channels were sufficient for human MCG measurements.

The chest of a male human subject was aligned with the rubidium vapor cell inside the wooden enclosure in the MSR. The stand-off distance between the chest of the subject and the vapor cell was about 1.3 cm, limited by both the microporous heat insulation and the wooden sheet. The vapor cell mapped the sufficiently large area of the heart. For medical applications, it is beneficial to image a much larger area, (e.g., 20 cm in diameter) to localize the source of the heart magnetic field signal. To this end, atomic magnetometers of the present disclosure can be modified by replacing, for example, a 6 cm-diameter vapor cell with a larger vapor cell and using higher power and broader laser beams. Or, an array of several atomic magnetometers can be constructed (similar to FIG. 5). In this case, the total number of atomic magnetometer sensing channels will increase to provide high-resolution mapping of the cardiac magnetic field.

Figure 10:
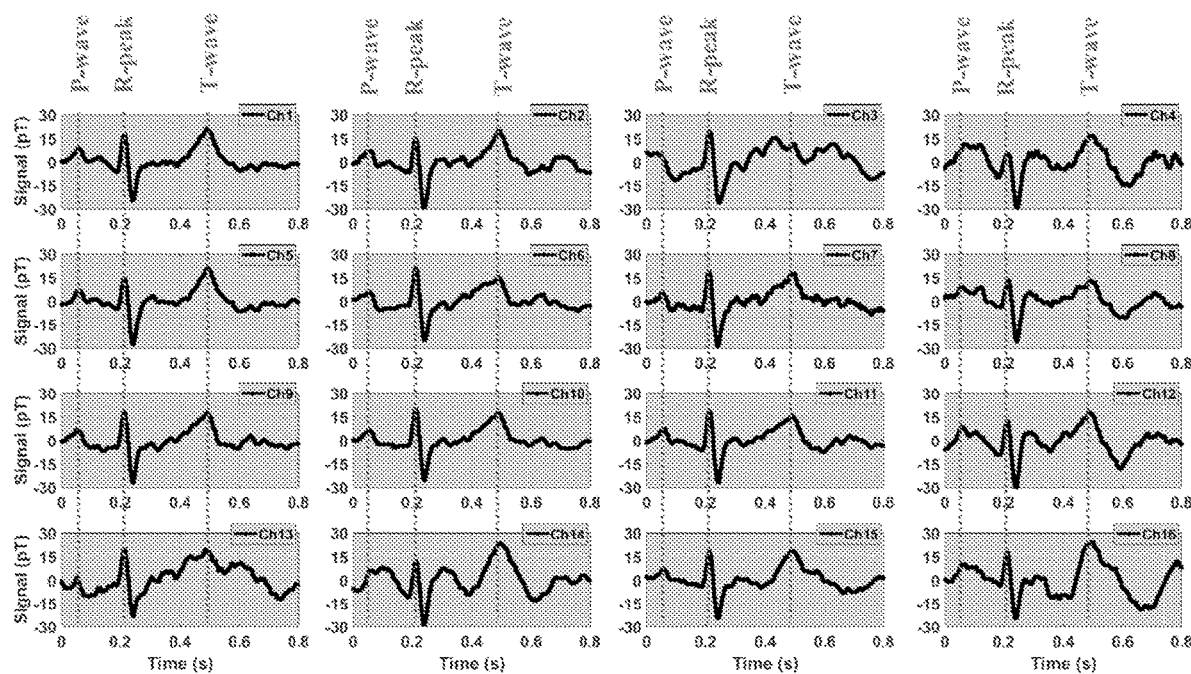
FIG. 10 shows raw human magnetocardiography (MCG) signals, simultaneously recorded by a 16-channel atomic magnetometer with a scan time of 0.8 s, in accordance with embodiments of the present disclosure.

FIG. 10 shows raw cardiac magnetic field signals from the human subject, simultaneously recorded by the atomic magnetometer with a 0.8 s scan time. Single-scan cardiac signals, filtered using a 1-40 Hz band-pass filter, were sufficient to observe the main events in the cardiac cycle: P-wave, R-peak, and T-wave in standard labeling. Compared to human MCG signals obtained by multi-channel MCG systems using multiple separate individual atomic magnetometers, all of which were not able to observe P-waves, the atomic magnetometer according to the present disclosure did not require data averaging due to its better field sensitivity, clearly measuring the P-waves. The first small hump with an about 10 pT amplitude occurs when the atria depolarize (P-wave), leading to the contraction of the atria. The second large peak with an amplitude of about 40 pT occurs when both the ventricles depolarize and the atria repolarize (R-peak). The last hump with an amplitude of about 20 pT occurs when the ventricles repolarize and the heart is ready for the next cycle (T-wave). The foregoing observation demonstrated that the atomic magnetometer of the present disclosure is able to achieve rapid parallel MCG measurements in an about 1 s single scan.

Figure 11:
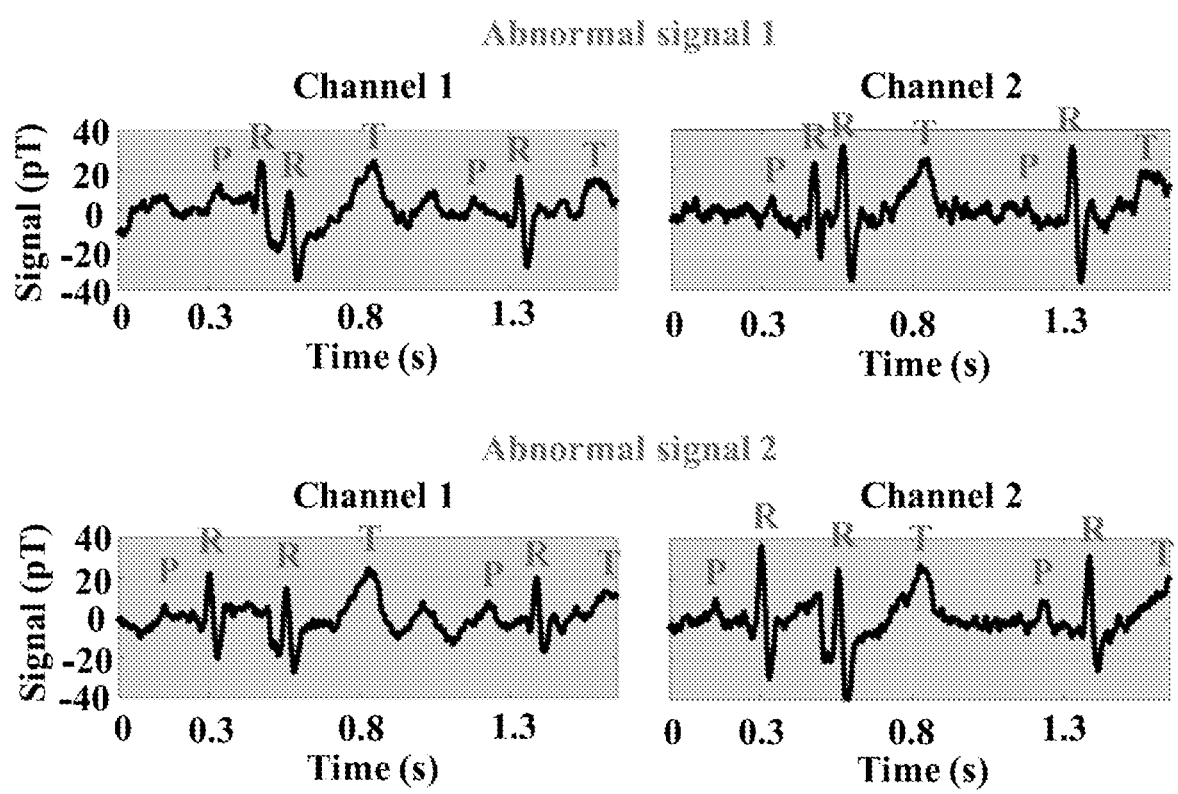
FIG. 11 shows two abnormal cases of cardiac activity that were observed during MCG measurements, in accordance with embodiments of the present disclosure.

During the MCG measurements, some abnormal cardiac cycles were observed. FIG. 11 illustrates two abnormal signals recorded in channels 1 and 2, as examples. In the two cases, the ventricles failed to repolarize to be ready for the next cardiac cycle after the ventricles depolarized. Instead, the ventricles quickly depolarized again. This cardiac rhythm might be an important signature of a heart disease. These results demonstrate that atomic magnetometers of the present disclosure can rapidly diagnose a certain malfunction of cardiac activity. In at least some examples, results output by an atomic magnetometer of the present disclosure may be used as a precursor to obtaining a more precise diagnosis from a cardiologist.

Overview of Terms and Abbreviations

The following explanations of terms are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting, unless otherwise indicated. Other features of the disclosure are apparent from the foregoing detailed description and the claims.

Unless otherwise indicated, all numbers expressing quantities of components, molecular weights, percentages, temperatures, times, and so forth, as used in the specification or claims, are to be understood as being modified by the term "about." Accordingly, unless otherwise indicated, implicitly or explicitly, the numerical parameters set forth are approximations that can depend on the desired properties sought and/or limits of detection under standard test conditions/methods.

While the present disclosure has been particularly described in conjunction with specific embodiments, it is evident that many alternatives, modifications, and variations will be apparent to those skilled in the art in light of the foregoing description. It is therefore contemplated that the appended claims will embrace any such alternatives, modifications, and variations as falling within the true spirit and scope of the present disclosure.

What is claimed is:

1. A single-module multi-channel atomic magnetometer that operates at room temperature, comprising:
    a single vapor cell comprising alkali-metal atoms and at least one buffer gas, the at least one buffer gas restricting motion of atomic spins of the alkali-metal atoms to produce a plurality of localized sensing volumes within the single vapor cell;
    a broad pump beam configured to orient electron spins of the alkali-metal atoms in a direction of the broad pump beam;
    a broad probe beam configured to measure tilts of electron spins with respect to an initial orientation caused by the broad pump beam, the tilts being produced by interactions between external magnetic fields and the oriented electron spins;
    a photodiode array configured to output a plurality of signals, each of the plurality of signals representing tilts of electron spins corresponding to a different sensing volume within the single vapor cell;
    a mirror configured to reflect the broad probe beam after the broad probe beam has passed through the single vapor cell; and
    a lens configured to create a reshaped broad probe beam from the broad probe beam that was reflected by the mirror, the lens further configured to direct the reshaped broad probe beam to the photodiode array.

2. The single-module multi-channel atomic magnetometer of claim 1, wherein the alkali-metal atoms comprise at least one of rubidium, potassium, or cesium.

3. The single-module multi-channel atomic magnetometer of claim 1, wherein the at least one buffer gas comprises at least one of helium or xenon.

4. The single-module multi-channel atomic magnetometer of claim 1, wherein the broad pump beam is circularly polarized.

5. The single-module multi-channel atomic magnetometer of claim 1, wherein the broad probe beam is linearly polarized.

6. The single-module multi-channel atomic magnetometer of claim 1, wherein the broad pump beam and the broad probe beam are simultaneously applied to the single vapor cell in a substantially parallel configuration.

7. The single-module multi-channel atomic magnetometer of claim 1, further comprising:
a distributed feedback (DFB) laser; and
an optical fiber,
wherein the DFB laser is configured to provide one of the broad pump beam or the broad probe beam to the optical fiber,
wherein the broad pump beam or the broad probe beam contacts the single vapor cell after the broad pump beam or the broad probe beam is emitted from the optical fiber.

8. The single-module multi-channel atomic magnetometer of claim 1, further comprising:
a beam splitter configured to receive the broad probe beam after the broad probe beam is emitted from the single vapor cell, the beam splitter further configured to split the broad probe beam into a first beam and a second beam, the beam splitter configured to direct the first beam to the photodiode array, the beam splitter configured to direct the second beam to a second photodiode array configured for normalization operations.

9. A method for operating a multi-channel atomic magnetometer in a single module, comprising:
receiving a single vapor cell comprising alkali-metal atoms and at least one buffer gas, the at least one buffer gas restricting motion of atomic spins of the alkali-metal atoms to produce a plurality of localized sensing volumes within the single vapor cell;
orienting, using a broad pump beam, electron spins of the alkali-metal atoms in a direction of the broad pump beam;
directing a broad probe beam through the single vapor cell and to a mirror, the broad probe beam measuring tilts of electron spins with respect to an initial orientation caused by the broad pump beam, the tilts being produced by interactions between external magnetic fields and the oriented electron spins;
directing the broad probe beam from the mirror and to a lens configured to create a reshaped broad probe beam; and
outputting a plurality of signals using a photodiode array configured to detect the reshaped broad probe beam, each of the plurality of signals representing tilts of electron spins corresponding to a different sensing volume within the single vapor cell.

10. The method of claim 9, wherein the alkali-metal atoms comprise at least one of rubidium, potassium, or cesium.

11. The method of claim 9, wherein the at least one buffer gas comprises at least one of helium or xenon.

12. The method of claim 9, wherein:
the broad pump beam is circularly polarized;
the broad probe beam is linearly polarized; and
the broad pump beam and the broad probe beam are simultaneously applied to the single vapor cell.

13. The method of claim 9, further comprising:
directing the reshaped broad probe beam to a beam splitter configured to split the reshaped broad probe beam into a first beam and a second beam, the beam splitter configured to direct the first beam to the photodiode array, the beam splitter configured to direct the second beam to a second photodiode array configured for normalization operations.

14. A device comprising:
a plurality of multi-channel atomic magnetometers, each of the plurality of multi-channel atomic magnetometers comprising:
a single vapor cell comprising alkali-metal atoms and at least one buffer gas, the at least one buffer gas restricting motion of atomic spins of the alkali-metal atoms to produce a plurality of localized sensing volumes within the single vapor cell,
a broad pump beam configured to orient electron spins of the alkali-metal atoms in a direction of the broad pump beam,
a broad probe beam configured to measure tilts of electron spins with respect to an initial orientation caused by the broad pump beam, the tilts being produced by interactions between external magnetic fields and the oriented electron spins,
a photodiode array configured to output a plurality of signals, each of the plurality of signals representing tilts of electron spins corresponding to a different sensing volume within the single vapor cell,
a mirror configured to reflect the broad probe beam after the broad probe beam has passed through the single vapor cell, and
a lens configured to create a reshaped broad probe beam from the broad probe beam that was reflected by the mirror, the lens further configured to direct the reshaped broad probe beam to the photodiode array,
wherein the plurality of multi-channel atomic magnetometers comprises a first multi-channel atomic magnetometer and a second multi-channel atomic magnetometer, the first multi-channel atomic magnetometer and the second multi-channel atomic magnetometer oriented to detect different external magnetic fields produced by a subject.

15. The device of claim 14, wherein the alkali-metal atoms comprise at least one of rubidium, potassium, or cesium.

16. The device of claim 14, wherein the at least one buffer gas comprises at least one of helium or nitrogen.

17. The device of claim 14, wherein:
the broad pump beam is circularly polarized;
the broad probe beam is linearly polarized; and
the broad pump beam and the broad probe beam are simultaneously applied to the single vapor cell.

18. The device of claim 14, wherein the plurality of multi-channel atomic magnetometers comprises 25 multi-channel atomic magnetometers.

19. The device of claim 18, wherein the vapor cells of the 25 multi-channel atomic magnetometers combined produce 400 localized sensing volumes.

20. The device of claim 14, wherein each of the plurality of multi-channel atomic magnetometers further comprises a coil configured to generate a local field.

* * * * *